(12) United States Patent
Mueller

(10) Patent No.: US 6,807,217 B2
(45) Date of Patent: Oct. 19, 2004

(54) TUNING A LASER

(75) Inventor: Emmerich Mueller, Aidlingen (DE)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/101,044

(22) Filed: Mar. 19, 2002

(65) Prior Publication Data

US 2002/0181537 A1 Dec. 5, 2002

(30) Foreign Application Priority Data

Jun. 1, 2001 (EP) ............................................. 01113372

(51) Int. Cl.⁷ ............................................. H01S 3/08
(52) U.S. Cl. ............................................. 372/102
(58) Field of Search ............................ 372/102, 107; 370/20, 18; 359/122

(56) References Cited

U.S. PATENT DOCUMENTS

| | | | | |
|---|---|---|---|---|
| 4,229,710 A | * | 10/1980 | Shoshan | 372/102 |
| 5,319,668 A | * | 6/1994 | Luecke | 372/107 |
| 5,862,162 A | * | 1/1999 | Maeda | 372/20 |
| 5,867,512 A | * | 2/1999 | Sacher | 372/20 |
| 6,304,586 B1 | * | 10/2001 | Pease et al. | 372/38.02 |
| 6,366,592 B1 | * | 4/2002 | Flanders | 372/18 |
| 2002/0126345 A1 | * | 9/2002 | Green et al. | 359/122 |
| 2002/0181517 A1 | * | 12/2002 | Nebendahl | 372/20 |

FOREIGN PATENT DOCUMENTS

| | | |
|---|---|---|
| DE | XP-000775842 | 2/1996 |
| DE | 195 09 922 A1 | 9/1996 |
| DE | 198 32 750 A1 | 2/2000 |

OTHER PUBLICATIONS

Classen, L., Examiner. European Search Report, Application No. EP 01 11 3372, dated Dec. 18, 2002.
Wandt, D. et al. "Continuously Tunable External–Cavity Diode Laser With a Double–Grating Arrangement," Optics Letters, Optical Society of America, XP 000690335, vol. 22, No. 6, Washington, U.S., Mar. 15, 1997, pp. 390–392.

* cited by examiner

*Primary Examiner*—Quyen Leung
*Assistant Examiner*—Hung Tran Vy

(57) ABSTRACT

A method and an apparatus for tuning a laser includes creating a laser with a path between a cavity end element and a tuning element of an external cavity, both being a high reflective or semitransparent mirror, selecting at least one longitudinal mode of the laser by introducing a dispersion element in the path of the laser, rotating the tuning element about a pivot axis theoretically defined by the intersection of the surface planes of the cavity end element, the dispersion element and the tuning element to tune the laser. The method and apparatus also provides for moving the dispersion element along such a predetermined path to at least partly compensate an inclination between the real position of the pivot axis and the theoretically defined position.

16 Claims, 2 Drawing Sheets

TUNING A LASER

BACKGROUND OF THE INVENTION

The present invention relates to laser tuning.

In the optical communication industry there is a need for testing optical components and amplifiers with lasers that can be tuned in wavelength continuously without mode hopping. To perform these tests Littman cavities can be used as external cavities to allow single-mode tuning of the laser. The geometry of these cavities is known, see e.g.: Liu and Littman, "Novel geometry for single-mode scanning of tunable lasers", Optical Society of America, 1981, which article is incorporated herein by reference. The advantage of the Littman cavity is that it is possible to tune the wavelength and the optical length of the cavity at the same time by changing only one parameter of the geometry, i.e. the tuning element.

Examples of tunable lasers, in particular based on the Littman geometry, can be found e.g. in U.S. Pat. No. 5,867,512, DE-A-19509922, Wenz H. et al: "Continuously Tunable Diode Laser" in 'Laser und Optoelekronik' (Fachverlag GmbH, Stuttgart, D E, Vol.28 No.1, p.58–62, Feb. 1, 1996, XP000775842, ISSN: 0722–9003), Wandt D. et al: "Continuously Tunable External-Cavity Diode Laser with a Double-Grating Arrangement" (Optics Letter, Optical Society of America, Washington, US, vol.22, no.6, Mar. 15, 1997, pages 390–392, XP000690335, ISSN: 0146-9592), DE-A-19832750, EP-A-938171, JP-A-05 267768, or U.S. Pat. No. 5,319,668.

However, the Littman geometry is extremely sensible to deviations of the real geometry with respect to the perfect Littman configuration. This does impose severe requirements on the rotation mount for the tuning element of the Littman cavity. Smallest errors in the positioning of the pivot axis of the tuning element reduce the full feedback tuning range of a tuning element of the cavity heavily. This requires costly precision when manufacturing and maintaining such tunable lasers.

SUMMARY OF THE INVENTION

Therefore, it is an object of the invention to provide improved tuning of a laser. The object is solved by the independent claims.

An advantage of the present invention is the provision of a tunable laser which autonomously and easily compensates for deviations, e.g. an inclination of the real position of the pivot axis of the tuning element with respect to the theoretical perfect position of the pivot axis, so that over the tuning range of the tuning element it is possible to have the full feedback of the tuning element. At least, the compensation is sufficient to keep the feedback power of the tuning element at least near its maximum within a predetermined tuning range of the tuning element. The compensation is done by moving the dispersion element, preferably along a predetermined path, corresponding with the rotation of the tuning element. Therefore, method and apparatus for tuning of lasers according to the present invention avoid the aforementioned problems of the prior art and provide a tunable laser with a wide full feedback tuning range without heavy duties to the precision when manufacturing and maintaining such laser.

In a preferred embodiment of the present invention the moving of the dispersion element is done simultaneously with the rotation of the tuning element. This achieves an online correction, so that always the correct position of the dispersion element for the full feedback of the tuning element is guaranteed.

In another preferred embodiment of the invention the correction is done by moving the dispersion element by tilting it by a predetermined angle about a predetermined tilting axis. This way of correction can be easily implemented in the inventive apparatus, e.g. by using a bimorph type piezo-electric element that can precisely move the respective tuning element of the laser.

In yet another preferred embodiment of the invention the correction is done by a dispersion element which is a diffraction grating and in which the tilting axis is at least not parallel, more preferred perpendicular, to the axes of the rules of the grating. This positioning serves for maximum efficiency of the inventive method and apparatus.

In another preferred example of the invention the method further comprises steps for at least approximately evaluating a function which determines the tilting angle of the dispersion element for keeping the feedback power of the tuning element at least near its maximum within a predetermined tuning range of the tuning element per rotating angle of the tuning element. This calculation is done by: step a: rotating the tuning element to tune the laser to one wavelength, step b: tilting the dispersion element until the feedback power is substantially at its maximum, repeating steps a and b at least one time at another wavelength, using the at least two values of tilting angle per rotating angle to evaluate an approximation of the function which determines the tilting angle per rotating angle. This can be done fast and easy so that a quick adjustment of the apparatus for full feedback of the tuning element is achieved.

After performing the above described determination it is preferred to move the dispersion element according to the approximation function before or while rotating the tuning element.

Other preferred embodiments are shown by the dependent claims.

It is clear that the invention can be partly embodied or supported by one or more suitable software programs, which can be stored on or otherwise provided by any kind of data carrier, and which might be executed in or by any suitable data processing unit.

BRIEF DESCRIPTION OF THE DRAWINGS

Other objects and many of the attendant advantages of the present invention will be readily appreciated and become better understood by reference to the following detailed description when considering in connection with the accompanied drawings. The components in the drawings are not necessarily to scale, emphasis instead being placed upon clearly illustrating the principles of the present invention. Features that are substantially or functionally equal or similar will be referred to with the same reference sign(s).

DETAILED DESCRIPTION OF THE INVENTION

Figure 1:
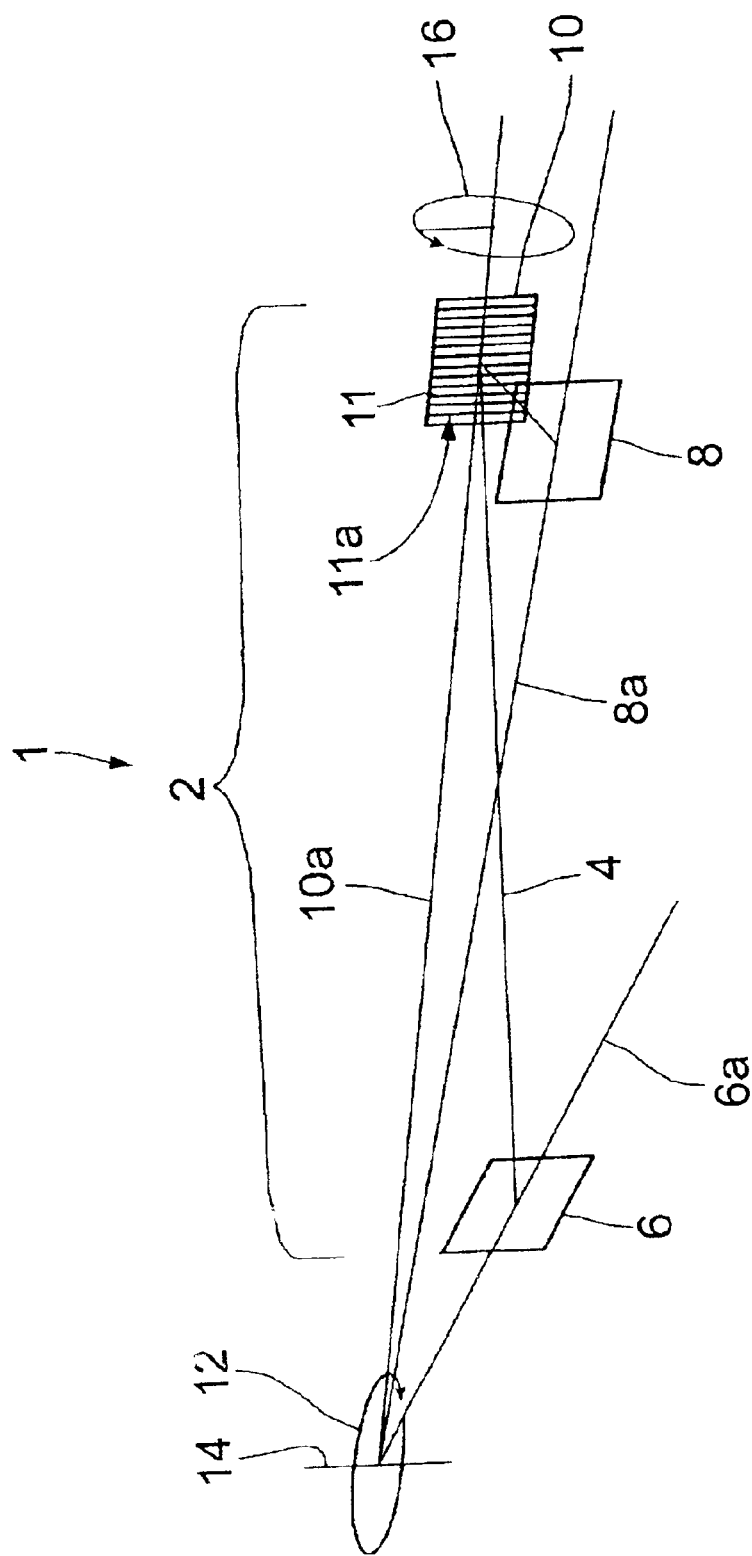
FIG. 1 shows a schematic view of a first embodiment of the apparatus of the present invention.

Referring now in greater detail to the drawings, FIG. 1 shows a schematic view of a first embodiment 1 of the apparatus of the present invention. The apparatus 1 of FIG. 1 comprises an external cavity 2 in which laser light provided by an active medium (not shown), e.g. a laser diode, can resonate to provide a laser beam 4. The beam 4 travels in the cavity 2 along a path between a cavity end element 6 and a tuning element 8 of the external cavity 2. The cavity end element 6 and the tuning element 8 both providing a high reflective mirror. The apparatus 1 further comprises a dispersion element 10 introduced in the path of the beam 4 for selecting at least one longitudinal mode of the laser. The dispersion element comprises a grating 11 having rules 11a.

The tuning element 8 can be rotated by an actuator (not shown) according to arrow 12 about a pivot axis 14 to tune the laser. The pivot axis 14 is theoretically defined by the intersection of the surface plane (indicated by line 6a) of the cavity end element 6, the surface plane (indicated by line 10a) of the dispersion element 10 and the surface plane (indicated by line 8a) of the tuning element 8.

The dispersion element 10 is mounted on one end of an electrically driven bimorph type piezo-electric element (not shown) which serves as the moving element of the invention. One end of the bimorph type piezo-electric element is freely slewable whereas the other end of the bimorph type piezo-electric element is fixed relative to the cavity 2.

The bimorph type piezo-electric element allows moving the dispersion element 10 corresponding, preferably simultaneously, with the rotation of the tuning element 8 to compensate an inclination between the real position of the pivot axis 14 and the theoretically defined position. This is done preferably by moving the dispersion element 10 along such a predetermined path that the compensation is sufficient to keep the feedback power of the tuning element 8 near its maximum within a predetermined tuning range of the tuning element 8. Moving the dispersion element 10 in this embodiment means tilting the dispersion element 10 according to arrow 16 by a predetermined angle (for the predetermination of the angle see below) about the tilting axis 10a which is substantially perpendicular to the rules 11a and lies substantially in the plane of the grating 11.

The apparatus of FIG. 1 preferably further comprises as a measuring device a wire strain gauge (not shown) for measuring the tilting angle 16 of the tilting of the dispersion element 10 and to output a measured value of the tilting angle 16, a comparator (not shown) connected with the wire strain gauge for comparing the measured value of the tilting angle 16 with the predetermined value of the tilting angle 16 and to output a signal indicating a difference between the measured value and the predetermined value of the tilting angle 16, a controller (not shown) connected with the output of the comparator and with the moving element for adjusting the tilting angle 16 when the comparator has detected a difference between the measured value and the predetermined value.

For the above mentioned predetermination of the predetermined value of the tilting angle 16 of the dispersion element 10 the following steps can be performed: step a: rotating the tuning element 8 to tune the laser to one wavelength, step b: tilting the dispersion element 10 until the feedback power is substantially at its maximum, repeating steps a and b at least one time at another wavelength, using the at least two values of tilting angle 16 per rotating angle 12 to evaluate an approximation of the function which determines the tilting angle 16 per rotating angle 12. The approximation can be done by known approximation methods. The more repeats of steps a and b are performed the more exact is the predetermination.

Figure 2:
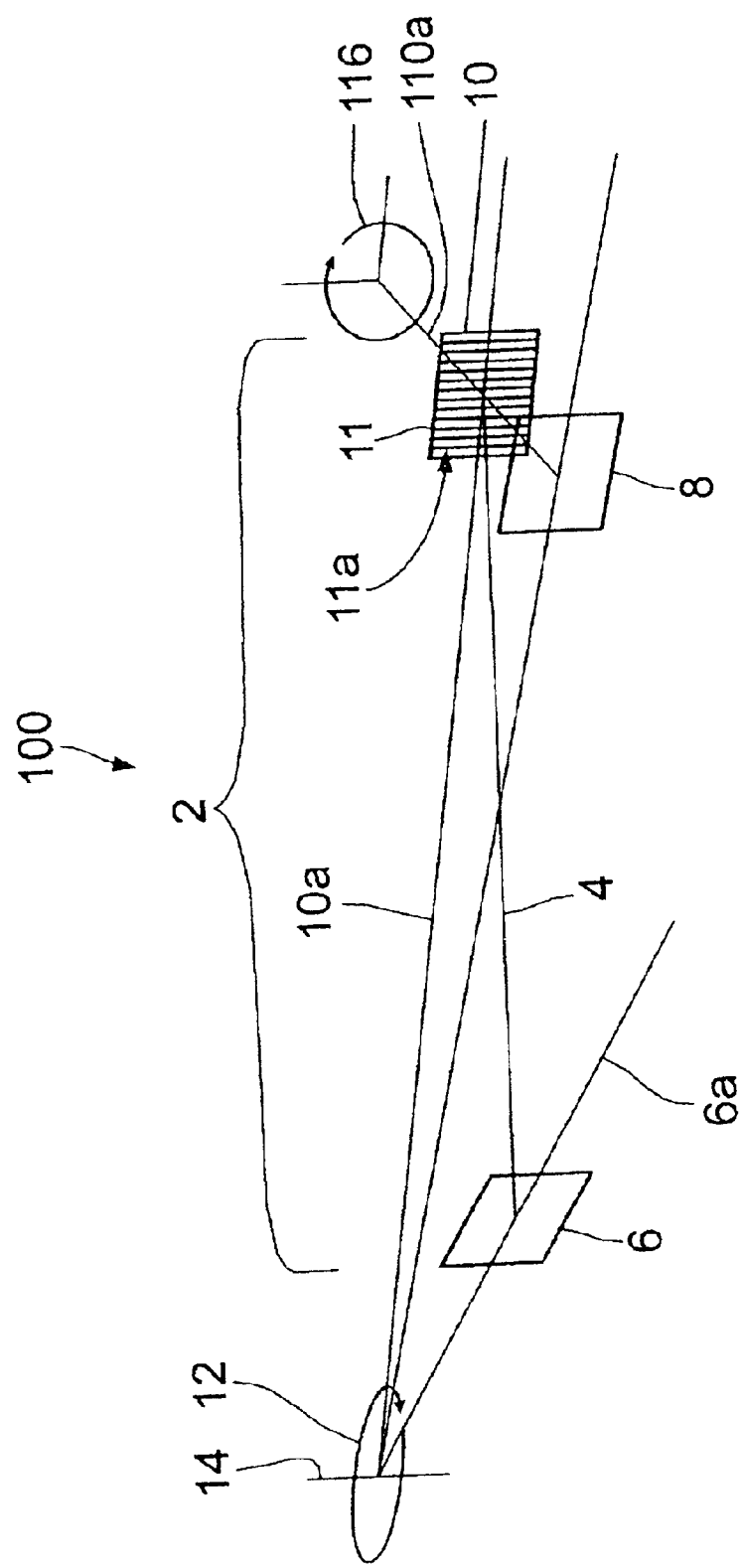
FIG. 2 shows a schematic view of a second embodiment of the apparatus of the present invention.

FIG. 2 shows a schematic view of a second embodiment 100 of the apparatus of the present invention.

The only difference between embodiment 1 of FIG. 1 and embodiment 100 of FIG. 2 is that of the dispersion element 10 has a different tilting axis 110a. The tilting axis 110a of embodiment 100 is perpendicular both to the plane of the grating 11 and to the rules of the grating 11 of the dispersion element 10. Accordingly, the dispersion element 10 can be tilted according to arrow 116 of FIG. 2. The inventive effect is reached with embodiment 100, also. The predetermination of the tilting angle 116 is done corresponding to the aforedescribed method for predetermination of the tilting angle 16 of the embodiment of FIG. 1.

It is clear that the positioning of the axes 14, 6a, 8a, 10a, 110a according to the FIGS. 1 and 2 only show the ideal case of the positioning of the axes 14, 6a, 8a, 10a, 110a. The axes 14, 6a, 8a, 10a, 110a however can be positioned in another way, i.e. in other angles or positions as shown in FIGS. 1 and 2, e.g. in other angles relative to the cavity end element 6, the tuning element 8 and the dispersion element 10. Moreover, the axes 14, 6a, 8a, 10a, 110a can be combined with each other.

Additionally, it is possible to have variations in the position of the axes 14, 6a, 8a, 10a, 110a during the rotation about the axes 14, 10a, 110a. E.g. these variations can be caused by the piezo-electric element for rotating the cavity end element 6, the tuning element 8 or the dispersion element 10. However, these variations can be corrected by calibrating the inventive apparatus 1 or 2.

What is claimed is:

1. A method of tuning a laser, comprising:

providing a laser beam to a path between a cavity end element having surface planes and a tuning element of an external cavity;

selecting a mode of said laser by introducing a dispersion element in said path;

rotating the tuning element about a pivot axis to tune said laser, wherein said pivot axis is defined by an intersection of a first surface plane of said cavity end element, a second surface plane of said dispersion element, and a third surface plane of said tuning element; and moving the dispersion element to at least partly compensate for an inclination between a real position of the pivot axis and the defined position, and wherein said moving of said dispersion element is executed corresponding with said rotating of said tuning element.

2. The method of claim 1, further comprising:

moving the dispersion element by tilting it by a predetermined angle about a predetermined tilting axis.

3. The method of claim 2, further comprising:

at least approximately evaluating a function which determines the tilting angle of the dispersion element for keeping the feedback power of the tuning element at least near its maximum within a predetermined tuning range of the tuning element per rotating angle of the tuning element, by:

rotating the tuning element to tune the laser to one wavelength, tilting the dispersion element until the feedback power is substantially at its maximum, repeating rotating the tuning element and tilting the dispersion element at least one time at another wavelength, and using the at least two values of tilting angle per rotating angle to evaluate an approximation of the function which determines the tilting angle per rotating angle.

4. The method of claims 3, further comprising:
moving the dispersion element according to the approximation before or while rotating the tuning element.

5. The method of claims 3, further comprising:
measuring the tilting angle of the tilting of the dispersion element,
comparing the measured value of the tilting angle with the predetermined value, and
adjusting the tilting angle when detecting a difference between the measured value and the predetermined value.

6. The method of claim 1, further comprising moving the dispersion element simultaneously with the rotation of the tuning element.

7. A software program or product, stored on a data carrier, for executing a method of tuning a laser when run on a data processing system, said method comprising:
providing a laser beam to a path between a cavity end element having surface planes and a tuning element of an external cavity,
selecting at least one mode of the laser by introducing a dispersion element being in the path of the laser,
rotating the tuning element about a pivot axis to tune the laser, the pivot axis being defined by an intersection of a surface plane of the cavity end element, the dispersion element and the tuning element, and
moving the dispersion element in order to at least partly compensate for an inclination between a real position of the pivot axis and the defined position.

8. An apparatus for tuning a laser, comprising:
an external cavity for receiving a laser beam in a path between a cavity end element and a tuning element of the external cavity,
a dispersion element introduced in the path of the laser for selecting at least one mode of the laser,
a pivot axis being defined by an intersection of a surface plane of the cavity end element, the dispersion element and the tuning element about which the tuning element can be rotated to tune the laser, and
a moving element for moving the dispersion element to at least partly compensate for an inclination between a real position of the pivot axis and the defined position.

9. The apparatus of claim 8, wherein the moving element is capable of moving the dispersion element along such a predetermined path that the compensation is sufficient to keep the feedback power of the tuning element at least near its maximum within a predetermined tuning range of the tuning element.

10. The apparatus of claim 9, wherein the moving element comprises a tilting element for tilting the dispersion element by a predetermined value of a tilting angle about a predetermined tilting axis.

11. The apparatus of claim 10, wherein the dispersion element comprises a diffraction grating and wherein the tilting axis is at least not parallel to the axis of the rules of the grating.

12. The apparatus of claim 11, wherein the tilting axis is substantially perpendicular to the axes of the rules.

13. The apparatus of claim 12, wherein the tilting axis lies substantially in the plane of the grating.

14. The apparatus of claim 8, wherein the moving element comprises a bimorph type piezo-electric element.

15. The apparatus of claim 14, wherein the dispersion element is mounted on one end of the bimorph type piezo-electric element which end is freely slewable whereas another end of the bimorph type piezo-electric element is fixed relative to the cavity.

16. The apparatus of claim 8, further comprising:
a measuring device for measuring the tilting angle of the tilting of the dispersion element,
a comparator connected with the measuring device for comparing the measured value of the tilting angle with the predetermined value of the tilting angle, and
a controller connected with the moving element for adjusting the tilting angle when the comparator has detected a difference between the measured value and the predetermined value.

* * * * *